United States Patent
Chen et al.

(10) Patent No.: US 12,218,093 B2
(45) Date of Patent: *Feb. 4, 2025

(54) SEMICONDUCTOR DIE CONNECTION SYSTEM AND METHOD

(71) Applicant: Taiwan Semiconductor Manufacturing Co., Ltd., Hsinchu (TW)

(72) Inventors: Ming-Fa Chen, Taichung (TW); Chen-Hua Yu, Hsinchu (TW); Sen-Bor Jan, Tainan (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/332,990

(22) Filed: Jun. 12, 2023

(65) Prior Publication Data

US 2023/0326895 A1 Oct. 12, 2023

Related U.S. Application Data

(60) Continuation of application No. 17/837,492, filed on Jun. 10, 2022, now Pat. No. 11,855,029, which is a
(Continued)

(51) Int. Cl.
*H01L 23/00* (2006.01)
*H01L 21/56* (2006.01)
(Continued)

(52) U.S. Cl.
CPC ............ *H01L 24/16* (2013.01); *H01L 21/561* (2013.01); *H01L 21/565* (2013.01); *H01L 21/76898* (2013.01); *H01L 21/78* (2013.01); *H01L 21/784* (2013.01); *H01L 23/3185* (2013.01); *H01L 23/481* (2013.01); *H01L 23/5384* (2013.01); *H01L 24/17* (2013.01); *H01L 24/94* (2013.01);
(Continued)

(58) Field of Classification Search
CPC ............ H01L 21/76898; H01L 21/561; H01L 21/566; H01L 24/94; H01L 25/0657; H01L 25/50; H01L 25/18; H01L 2224/0401; H01L 2224/0557; H01L 2224/1403; H01L 2224/14181; H01L 2224/16145; H01L 2224/16225
See application file for complete search history.

(56) References Cited

U.S. PATENT DOCUMENTS 4,811,082 A 3/1989 Jacobs et al.
4,990,462 A 2/1991 Sliwa
(Continued)

*Primary Examiner* — David A Zarneke
(74) *Attorney, Agent, or Firm* — Slater Matsil, LLP

(57) ABSTRACT

A system and method for connecting semiconductor dies is provided. An embodiment comprises connecting a first semiconductor die with a first width to a second semiconductor die with a larger second width and that is still connected to a semiconductor wafer. The first semiconductor die is encapsulated after it is connected, and the encapsulant and first semiconductor die are thinned to expose a through substrate via within the first semiconductor die. The second semiconductor die is singulated from the semiconductor wafer, and the combined first semiconductor die and second semiconductor die are then connected to another substrate.

20 Claims, 4 Drawing Sheets

Related U.S. Application Data division of application No. 16/715,600, filed on Dec. 16, 2019, now Pat. No. 11,387,205, which is a continuation of application No. 15/375,690, filed on Dec. 12, 2016, now Pat. No. 10,510,701, which is a continuation of application No. 14/875,499, filed on Oct. 5, 2015, now Pat. No. 9,520,340, which is a continuation of application No. 13/947,953, filed on Jul. 22, 2013, now Pat. No. 9,153,540, which is a continuation of application No. 13/346,398, filed on Jan. 9, 2012, now Pat. No. 8,518,796.

(51) Int. Cl.

| | |
|---|---|
| *H01L 21/768* | (2006.01) |
| *H01L 21/78* | (2006.01) |
| *H01L 21/784* | (2006.01) |
| *H01L 23/31* | (2006.01) |
| *H01L 23/48* | (2006.01) |
| *H01L 23/538* | (2006.01) |
| *H01L 25/00* | (2006.01) |
| *H01L 25/065* | (2023.01) |
| *H01L 25/18* | (2023.01) |

(52) U.S. Cl.
CPC .......... *H01L 25/0657* (2013.01); *H01L 25/50* (2013.01); *H01L 21/566* (2013.01); *H01L 23/3114* (2013.01); *H01L 25/18* (2013.01); *H01L 2224/0401* (2013.01); *H01L 2224/0557* (2013.01); *H01L 2224/1403* (2013.01); *H01L 2224/14181* (2013.01); *H01L 2224/16145* (2013.01); *H01L 2224/16146* (2013.01); *H01L 2224/16225* (2013.01); *H01L 2224/32145* (2013.01); *H01L 2224/73204* (2013.01); *H01L 2224/94* (2013.01); *H01L 2225/06513* (2013.01); *H01L 2225/06517* (2013.01); *H01L 2225/06541* (2013.01); *H01L 2225/06555* (2013.01); *H01L 2225/06568* (2013.01); *H01L 2225/06582* (2013.01); *H01L 2924/00014* (2013.01); *H01L 2924/01029* (2013.01); *H01L 2924/1431* (2013.01); *H01L 2924/1434* (2013.01); *H01L 2924/15787* (2013.01); *H01L 2924/181* (2013.01); *H01L 2924/351* (2013.01)

(56) References Cited

U.S. PATENT DOCUMENTS

| | | | |
|---|---|---|---|
| 5,075,253 A | 12/1991 | Sliwa | |
| 5,380,681 A | 1/1995 | Hsu | |
| 5,481,133 A | 1/1996 | Hsu | |
| 6,002,177 A | 12/1999 | Gaynes et al. | |
| 6,187,678 B1 | 2/2001 | Gaynes et al. | |
| 6,229,216 B1 | 5/2001 | Ma et al. | |
| 6,236,115 B1 | 5/2001 | Gaynes et al. | |
| 6,271,059 B1 | 8/2001 | Bertin et al. | |
| 6,279,815 B1 | 8/2001 | Correia et al. | |
| 6,355,501 B1 | 3/2002 | Fung et al. | |
| 6,434,016 B2 | 8/2002 | Zeng et al. | |
| 6,448,661 B1 | 9/2002 | Kim et al. | |
| 6,461,895 B1 | 10/2002 | Liang et al. | |
| 6,562,653 B1 | 5/2003 | Ma et al. | |
| 6,570,248 B1 | 5/2003 | Ahn et al. | |
| 6,600,222 B1 | 7/2003 | Levardo | |
| 6,607,938 B2 | 8/2003 | Kwon et al. | |
| 6,661,085 B2 | 12/2003 | Kellar et al. | |
| 6,762,076 B2 | 7/2004 | Kim et al. | |
| 6,790,748 B2 | 9/2004 | Kim et al. | |
| 6,887,769 B2 | 5/2005 | Kellar et al. | |
| 6,908,565 B2 | 6/2005 | Kim et al. | |
| 6,908,785 B2 | 6/2005 | Kim | |
| 6,924,551 B2 | 8/2005 | Rumer et al. | |
| 6,943,067 B2 | 9/2005 | Greenlaw | |
| 6,946,384 B2 | 9/2005 | Kloster et al. | |
| 6,975,016 B2 | 12/2005 | Kellar et al. | |
| 7,037,804 B2 | 5/2006 | Kellar et al. | |
| 7,056,807 B2 | 6/2006 | Kellar et al. | |
| 7,071,028 B2 | 7/2006 | Koike et al. | |
| 7,087,538 B2 | 8/2006 | Staines et al. | |
| 7,151,009 B2 | 12/2006 | Kim et al. | |
| 7,157,787 B2 | 1/2007 | Kim et al. | |
| 7,215,033 B2 | 5/2007 | Lee et al. | |
| 7,276,799 B2 | 10/2007 | Lee et al. | |
| 7,279,795 B2 | 10/2007 | Periaman et al. | |
| 7,307,005 B2 | 12/2007 | Kobrinsky et al. | |
| 7,317,256 B2 | 1/2008 | Williams et al. | |
| 7,320,928 B2 | 1/2008 | Kloster et al. | |
| 7,345,350 B2 | 3/2008 | Sinha | |
| 7,402,442 B2 | 7/2008 | Condorelli et al. | |
| 7,402,515 B2 | 7/2008 | Arana et al. | |
| 7,410,884 B2 | 8/2008 | Ramanathan et al. | |
| 7,432,592 B2 | 10/2008 | Shi et al. | |
| 7,494,845 B2 | 2/2009 | Hwang et al. | |
| 7,498,675 B2 * | 3/2009 | Farnworth .......... | H01L 25/0652 257/723 |
| 7,528,494 B2 | 5/2009 | Furukawa et al. | |
| 7,531,890 B2 | 5/2009 | Kim | |
| 7,557,597 B2 | 7/2009 | Anderson et al. | |
| 7,576,435 B2 | 8/2009 | Chao | |
| 7,834,450 B2 | 11/2010 | Kang | |
| 8,021,930 B2 | 9/2011 | Pagaila | |
| 8,169,065 B2 | 5/2012 | Kohl et al. | |
| 8,237,278 B2 | 8/2012 | Gluschenkov et al. | |
| 8,415,783 B1 | 4/2013 | Rahman et al. | |
| 8,513,802 B2 | 8/2013 | Ma et al. | |
| 8,518,796 B2 * | 8/2013 | Chen ....................... | H01L 25/50 257/E21.705 |
| 8,552,567 B2 | 10/2013 | England et al. | |
| 8,759,147 B2 | 6/2014 | Choi et al. | |
| 9,136,144 B2 | 9/2015 | Lim et al. | |
| 9,153,540 B2 * | 10/2015 | Chen ....................... | H01L 24/94 |
| 9,324,698 B2 | 4/2016 | Yu et al. | |
| 9,379,091 B2 | 6/2016 | England et al. | |
| 9,391,040 B2 | 7/2016 | Dang et al. | |
| 9,478,525 B2 | 10/2016 | Segawa et al. | |
| 9,520,340 B2 * | 12/2016 | Chen ....................... | H01L 24/94 |
| 9,601,465 B2 | 3/2017 | Kang et al. | |
| 10,510,701 B2 * | 12/2019 | Chen ....................... | H01L 24/94 |
| 11,387,205 B2 * | 7/2022 | Chen ....................... | H01L 24/94 |
| 2004/0113255 A1 | 6/2004 | Karnezos | |
| 2008/0308946 A1 | 12/2008 | Pratt | |
| 2009/0200662 A1 | 8/2009 | Ng et al. | |
| 2010/0148316 A1 | 6/2010 | Kim et al. | |
| 2010/0314738 A1 | 12/2010 | Chi et al. | |
| 2011/0014746 A1 | 1/2011 | Do et al. | |
| 2011/0068464 A1 | 3/2011 | Chi et al. | |
| 2011/0136321 A1 | 6/2011 | Kuroda et al. | |
| 2011/0186977 A1 | 8/2011 | Chi et al. | |
| 2012/0007229 A1 | 1/2012 | Bartley et al. | |
| 2012/0061814 A1 | 3/2012 | Camacho et al. | |
| 2012/0077314 A1 | 3/2012 | Park et al. | |
| 2012/0088332 A1 | 4/2012 | Lee et al. | |
| 2012/0223426 A9 | 9/2012 | Shim et al. | |
| 2012/0280405 A1 | 11/2012 | Hwang et al. | |
| 2012/0286404 A1 | 11/2012 | Pagaila | |
| 2013/0049208 A1 | 2/2013 | Cho et al. | |
| 2013/0299976 A1 | 11/2013 | Chen et al. | |
| 2014/0252605 A1 | 9/2014 | Ma et al. | |
| 2014/0264905 A1 | 9/2014 | Lee et al. | |
| 2015/0102468 A1 | 4/2015 | Kang et al. | |
| 2016/0218081 A1 | 6/2016 | Kim | |
| 2017/0092624 A1 | 3/2017 | Chen et al. | |
| 2018/0286835 A1 | 10/2018 | Nah | |

* cited by examiner

SEMICONDUCTOR DIE CONNECTION SYSTEM AND METHOD

PRIORITY CLAIM AND CROSS-REFERENCE

This application is a continuation of U.S. patent application Ser. No. 17/837,492, filed on Jun. 10, 2022, entitled "Semiconductor Die Connection System and Method," which is a divisional of U.S. patent application Ser. No. 16/715,600, filed on Dec. 16, 2019, entitled "Semiconductor Die Connection System and Method," now U.S. Pat. No. 11,387,205, issued on Jul. 12, 2022, which is a continuation of U.S. patent application Ser. No. 15/375,690, filed on Dec. 12, 2016, entitled "Semiconductor Die Connection System and Method," now U.S. Pat. No. 10,510,701, issued on Dec. 17, 2019, which is a continuation of U.S. patent application Ser. No. 14/875,499, filed on Oct. 5, 2015, entitled "Semiconductor Die Connection System and Method," now U.S. Pat. No. 9,520,340, issued on Dec. 13, 2016, which is a continuation of U.S. patent application Ser. No. 13/947,953, filed on Jul. 22, 2013, entitled "Semiconductor Die Connection System and Method," now U.S. Pat. No. 9,453,540, issued on Oct. 6, 2015, which is a continuation of U.S. patent application Ser. No. 13/346,398, filed Jan. 9, 2012, entitled "Semiconductor Die Connection System and Method," now U.S. Pat. No. 8,518,796, issued on Aug. 27, 2013, which applications are hereby incorporated herein by reference.

BACKGROUND

Generally, semiconductor systems may be manufactured by taking certain functionalities and separating these functionalities onto different semiconductor dies. By placing the different functionalities onto separate semiconductor dies, those separate semiconductor dies may be designed, tested, and manufactured separately from each other, thereby sparing the designers from the problems associated with integrating the functionalities onto a single semiconductor die. This type of design can save time and money in the overall design of the semiconductor system.

As an example of such a semiconductor system that may be designed using multiple dies, a semiconductor system may be broken down into a logical function and a memory function. The logical function may be designed and manufactured on a first semiconductor die and the complementary memory function for the logical function may be designed and manufactured on a second semiconductor die. The first semiconductor die and the second semiconductor die may then be physically and electrically bonded together in order to provide for a complete package that includes both the logical functionality and the memory functionality working together to provide a desired function.

However, because the first semiconductor die is designed and manufactured independently of the second semiconductor die, the considerations that are taken into account during the design of the first semiconductor die (e.g., the logic die) may be greatly different than the considerations that are taken into account during the design of the second semiconductor die (e.g., the memory die). These differences in consideration may then lead to physical and structural differences between the first semiconductor die and the second semiconductor die that may cause problems once the first semiconductor die and the second semiconductor die are bonded together.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION

The making and using of embodiments are discussed in detail below. It should be appreciated, however, that the embodiments provide many applicable concepts that can be embodied in a wide variety of specific contexts. The specific embodiments discussed are merely illustrative of specific ways to make and use the embodiments, and do not limit the scope of the embodiments.

The embodiments will be described with respect to embodiments in a specific context, namely a chip on memory (CoM) architecture. The embodiments may also be applied, however, to other chip, die, and wafer connection architectures.

Figure 1:
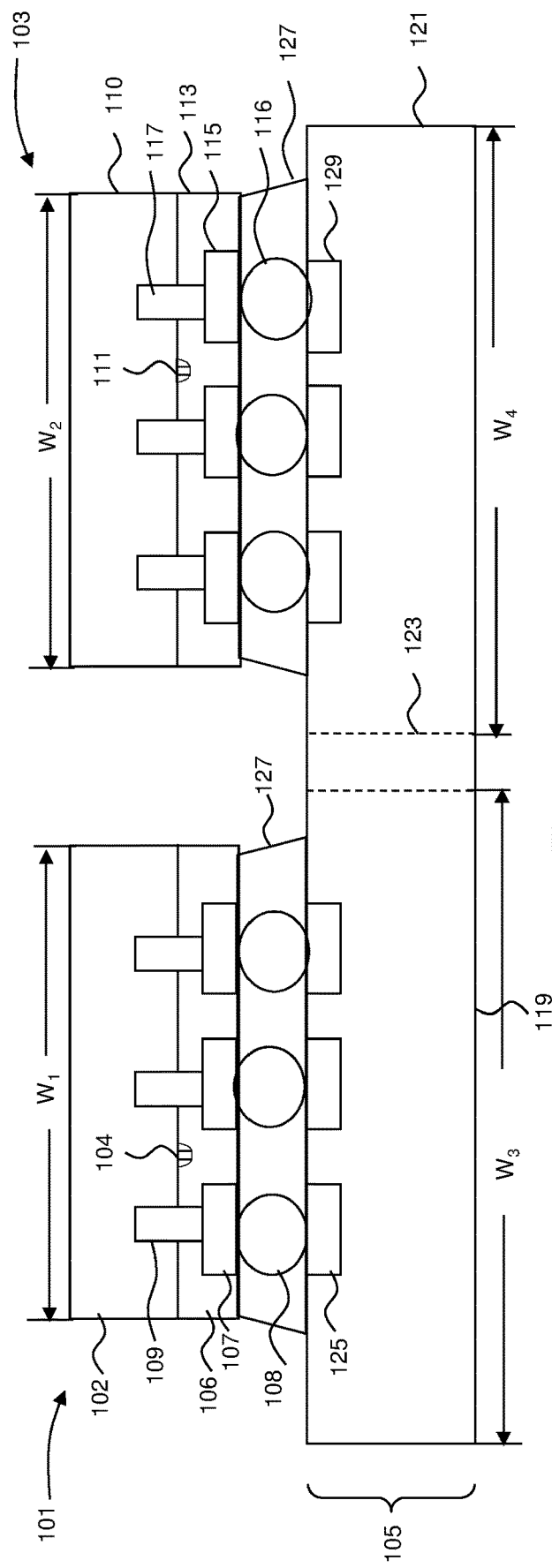
FIG. 1 illustrates a first semiconductor die and a second semiconductor die bonded to a semiconductor wafer in accordance with an embodiment.

With reference now to FIG. 1, there is shown a first semiconductor die 101 and a second semiconductor die 103 connected to a semiconductor wafer 105. In an embodiment the first semiconductor die 101 and the second semiconductor die 103 may be logic chips that may be utilized to provide a logic function. However, while the first semiconductor die 101 and the second semiconductor die 103 are presented in this embodiment as logic dies, the first semiconductor die 101 and the second semiconductor die 103 are not limited to logic dies, and may have any desired functionality.

The semiconductor wafer 105 may have formed within it a third semiconductor die 119 and a fourth semiconductor die 121. In an embodiment in which the first semiconductor die 101 and the second semiconductor die 103 are logic dies, the third semiconductor die 119 and the fourth semiconductor die 121 may be memory dies that may be used in conjunction with the first semiconductor die 101 and the second semiconductor die 103, respectively, in a chip on memory architecture. However, similar to the first semiconductor die 101 and the second semiconductor die 103, the third semiconductor die 119 and the fourth semiconductor die 121 are not limited to being memory dies, and may provide any suitable functionality that may be utilized in conjunction with the first semiconductor die 101 and the second semiconductor die 103, respectively.

The first semiconductor die 101 may comprise a first substrate 102, first active devices 104, first metallization layers 106, first contact pads 107, first external connectors 108, and first through-silicon vias (TSVs) 109. The first substrate 102 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The first active devices 104 are represented on FIG. 1 as a single transistor. However, as one of skill in the art will recognize, a wide variety of active and passive devices such as capacitors, resistors, inductors and the like may be used to generate the desired structural and functional requirements of the design. The first active devices 104 may be formed using any suitable methods either within or else on the surface of the first substrate 102.

The first metallization layers 106 may be formed over the first substrate 102 and the first active devices 104 and are designed to connect the various first active devices 104 to form functional circuitry. The first metallization layers 106 may be formed of alternating layers of dielectric and conductive material and may be formed through any suitable process (such as deposition, damascene, dual damascene, etc.). In an embodiment, there may be four layers of metallization separated from the first substrate 102 by at least one interlayer dielectric layer (ILD), but the precise number of first metallization layers 106 is dependent upon the design of the first semiconductor die 101.

The first TSVs 109 may be formed by applying and developing a suitable photoresist (not shown), and then etching the first metallization layers 106 and the first substrate 102 to generate TSV openings (filled later as discussed below). The openings for the first TSVs 109 at this stage may be formed so as to extend into the first substrate 102 at least further than the first active devices 104 formed within and on the first substrate 102, and preferably to a depth at least greater than the eventual desired height of the finished first semiconductor die 101. Accordingly, while the depth is dependent upon the overall design of the first semiconductor die 101, the depth may be between about 1 µm and about 700 µm below the surface on the first substrate 102, with a preferred depth of about 50 µm. The openings for the first TSVs 109 may be formed to have a diameter of between about 1 µm and about 100 µm, such as about 6 µm.

Once the openings for the first TSVs 109 have been formed, the openings for the first TSVs 109 may be filled with, e.g., a barrier layer and a conductive material. The barrier layer may comprise a conductive material such as titanium nitride, although other materials, such as tantalum nitride, titanium, a dielectric, or the like may alternatively be utilized. The barrier layer may be formed using a CVD process, such as PECVD. However, other alternative processes, such as sputtering or metal organic chemical vapor deposition (MOCVD), may alternatively be used. The barrier layer may be formed so as to contour to the underlying shape of the opening for the first TSVs 109.

The conductive material may comprise copper, although other suitable materials such as aluminum, alloys, doped polysilicon, combinations thereof, and the like, may alternatively be utilized. The conductive material may be formed by depositing a seed layer and then electroplating copper onto the seed layer, filling and overfilling the openings for the first TSVs 109. Once the openings for the first TSVs 109 have been filled, excess barrier layer and excess conductive material outside of the openings for the first TSVs 109 may be removed through a grinding process such as chemical mechanical polishing (CMP), although any suitable removal process may be used.

The first contact pads 107 may be formed to connect the first metallization layers 106 to exterior input/output connections, such as the first external connectors 108 (discussed further below). The first contact pads 107 may be formed of aluminum, although other materials, such as aluminum alloy, aluminum copper, copper, combinations of these, and the like, may alternatively be used. Further, the first contact pads 107 may be formed in a variety of methods depending upon the material used. For example, if aluminum is used the first contact pads 107 may be formed by forming a layer of aluminum over the first metallization layers 106, and then using a suitable technique such as photolithography and chemical etching to pattern the aluminum into the first contact pads 107. Alternatively, if copper is used the first contact pads 107 may be formed by initially forming a dielectric layer, forming openings into the dielectric layer, depositing a barrier layer and a seed layer (not shown), overfilling the openings with copper, and then using a grinding process such as CMP to remove excess copper outside of the openings to form the first contact pads 107. Any suitable process for forming the first contact pads 107 may be used and all of these processes are fully intended to be included within the scope of the present invention.

The first external connectors 108 may be formed to provide an external connection between the first contact pads 107 and external devices such as the third semiconductor die 119 (discussed further below). The first external connectors 108 may be contact bumps such as microbumps or controlled collapse chip connection (C4) bumps and may comprise a material such as tin, or other suitable materials, such as silver or copper. In an embodiment in which the first external connectors 108 are tin solder bumps, the first external connectors 108 may be formed by initially forming a layer of tin through any suitable method such as evaporation, electroplating, printing, solder transfer, ball placement, etc., to a preferred thickness of about 100 µm. Once a layer of tin has been formed on the structure, a reflow is preferably performed in order to shape the material into the desired bump shape.

In an embodiment the first semiconductor die 101 may be considered a small die, e.g., by having at least one dimension that is less than a dimension of that the die to which it will be bonded (e.g., the third semiconductor die 119). In an embodiment, the first semiconductor die 101 may have a first width $W_1$ (illustrated in FIG. 1) of between about 1 mm and about 25 mm, such as about 9 mm. The first semiconductor die 101 may also have a first length (not illustrated in FIG. 1 as it extends into and out of the figure) of between about 1 mm and about 32 mm, such as about 9 mm. However, as one of ordinary skill in the art will recognize, these illustrative dimensions are not intended to be limiting upon the first semiconductor die 101, as the first semiconductor die 101 may be any desired size that is smaller than the third semiconductor die 119 (discussed further below).

The second semiconductor die 103 may be similar to the first semiconductor die 101 in that the second semiconductor die 103 may also be a logic die designed to perform a logical function. Additionally, the second semiconductor die 103 may be formed from similar structures as the first semiconductor die 101, and may have, e.g., a second substrate 110, second active devices in, second metallization layers 113, second contact pads 115, second external connectors 116, and second TSVs 117. These structures may be formed from similar materials and in similar fashions as the structures in the first semiconductor die 101, although these structures may alternatively be formed from separate materials and in separate methods.

The second semiconductor die 103 may also be considered a small die, by, e.g., having at least one dimension that is less than the fourth semiconductor die 121 (discussed further below) to which the second semiconductor die 103 will be bonded. As one illustrative example, the second semiconductor die 103 may have a second width $W_2$ (illustrated in FIG. 1) of between about 1 mm and about 25 mm, such as about 9 mm, and a second length (not illustrated in FIG. 1 as it extends into and out of the Figure) of between about 1 mm and about 32 mm, such as about 9 mm. However, similar to the first semiconductor die 101, the second semiconductor die 103 may be any desired size as long as it has a smaller dimension than the die to which it will be bonded (e.g., the fourth semiconductor die 121).

Additionally, as one of ordinary skill in the art will recognize, the above description of the first semiconductor die 101 and the second semiconductor die 103 are merely illustrative embodiments and are not intended to limit the embodiments in any fashion. Any suitable die, functionality of the dies, or other structures such as redistribution substrates or interposers, may alternatively be utilized for the first semiconductor die 101 and the second semiconductor die 103. These and all such dies are fully intended to be included within the scope of the embodiments.

The semiconductor wafer 105 may be a wafer upon which a plurality of semiconductor dies has been formed. For clarity, FIG. 1 only illustrates the third semiconductor die 119 and the fourth semiconductor die 121, although more or less semiconductor dies may be formed within the semiconductor wafer 105. In an embodiment in which the first semiconductor die 101 and the second semiconductor die 103 are logic dies, the third semiconductor die 119 and the fourth semiconductor die 121 may be, e.g., memory dies that are to be used in conjunction with the first semiconductor die 101 and the second semiconductor die 103, respectively.

The third semiconductor die 119 and the fourth semiconductor die 121 may also have active and passive devices with metallization layers (not individually illustrated in FIG. 1) in order to provide a desired functionality such as a memory functionality. These active and passive devices and metallization layers may be formed in a similar fashion as the first active devices 104 and the first metallization layers 106 described above, but may alternatively be formed from different materials and different methods.

Additionally, the third semiconductor die 119 may have third contact pads 125 and the fourth semiconductor die 121 may have fourth contact pads 129 in order to provide external connections to the third semiconductor die 119 and the fourth semiconductor die 121, respectively. The third contact pads 125 and the fourth contact pads 129 may be formed of similar materials and may be formed in a similar fashion as the first contact pads 107, although they may alternatively be formed of different materials and in different methods than the first contact pads 107.

Between the third semiconductor die 119 and the fourth semiconductor die 121, the semiconductor wafer 105 may have a scribe line 123 in order to separate the third semiconductor die 119 and the fourth semiconductor die 121. The scribe line 123 may be formed by not placing functional structures (such as active devices) into the area intended for the scribe line 123. Other structures, such as test pads or dummy metals used for planarization, could be placed into the scribe line 123, but would not be necessary for the functioning of the third semiconductor die 119 or the fourth semiconductor die 121 once the third semiconductor dies 119 or the fourth semiconductor die 121 have been separated from the semiconductor wafer 105. The scribe line 123 may have a width of between about 20 µm and about 180 µm, such as about 80 µm.

The third semiconductor die 119 may be considered a large die in that it has at least one dimension that is greater than the die to which it will be bonded (e.g., the first semiconductor die 101). In an embodiment in which the third semiconductor die 119 will be bonded to the first semiconductor die 101, the third semiconductor die 119 may have a third width $W_3$ (illustrated in FIG. 1) that is larger than the first width $W_1$, such as between about 2 mm and about 26 mm, such as about 10 mm, and may have a third length (not illustrated in FIG. 1 as it extends into and out of the figure) of between about 2 mm and about 33 mm, such as about 10 mm. However, these dimensions are not intended to be limiting and the third semiconductor die 119 may have any desired dimensions as long as they are larger than the die to which the third semiconductor die 119 will be bonded (e.g. the first semiconductor die 101).

The fourth semiconductor die 121 may also be considered as a large die, in that it has at least one dimension that is greater than the die to which it will be bonded (e.g., the second semiconductor die 103). In an embodiment in which the fourth semiconductor die 121 will be bonded to the second semiconductor die 103, the fourth semiconductor die 121 may have a fourth width $W_4$ (illustrated in FIG. 1) that is larger than the second width $W_2$, such as between about 2 mm and about 26 mm, such as about 10 mm, and may have a fourth length (not illustrated in FIG. 1 as it extends into and out of the figure) of between about 2 mm and about 33 mm, such as about 10 mm. As such, the third semiconductor die 119 may have a larger footprint than the first semiconductor die 101, and the fourth semiconductor die 121 may have a larger footprint than the second semiconductor die 103.

The first semiconductor die 101 may be placed onto the third semiconductor die 119 on the semiconductor wafer 105 in a chip on wafer (CoW) configuration. In an embodiment the first semiconductor die 101 may be placed onto the third semiconductor die 119 in a face to face (F2F) configuration, with the first contact pads 107 facing and aligned with the third contact pads 125. Once aligned, the first external connectors 108 and the third contact pads 125 may then be bonded together by contacting the first external connectors 108 to the third contact pads 125 and performing a reflow to reflow the material of the first external connectors 108 and bond to the third contact pads 125. Any suitable method of bonding, however, such as copper-copper bonding, may alternatively be utilized to bond the first semiconductor die 101 to the third semiconductor die 119.

An underfill material 127 may be injected or otherwise formed in the space between the first semiconductor die 101 and the third semiconductor die 119. The underfill material 127 may, for example, comprise a liquid epoxy that is dispensed between the first semiconductor die 101 and the third semiconductor die 119, and then cured to harden. This underfill material 127 may be used to prevent cracks from being formed in the first external connectors 108, wherein cracks are typically caused by thermal stresses.

Alternatively, either a deformable gel or silicon rubber could be formed between the first semiconductor die 101 and the third semiconductor die 119 in order to help prevent cracks from occurring within the first external connectors 108. This gel or silicon rubber may be formed by injecting or otherwise placing the gel or rubber between the first semiconductor die 101 and the third semiconductor die 119.

The deformable gel or silicon rubber may also provide stress relief during subsequent processing.

The second semiconductor die 103 may be bonded to the fourth semiconductor die 121 on the semiconductor wafer 105 in a similar fashion as the first semiconductor die 101 is bonded to the third semiconductor die 119. For example, the second external connectors 116 may be aligned with the fourth contact pads 129 and then reflowed to bond the second external connectors 116 to the fourth contact pads 129, upon which an underfill material 127 may be placed between the second semiconductor die 103 and the fourth semiconductor die 121. However, any other suitable manner of bonding or connecting the second semiconductor die 103 to the fourth semiconductor die 121 on the semiconductor wafer 105 may alternatively be utilized.

Figure 2:
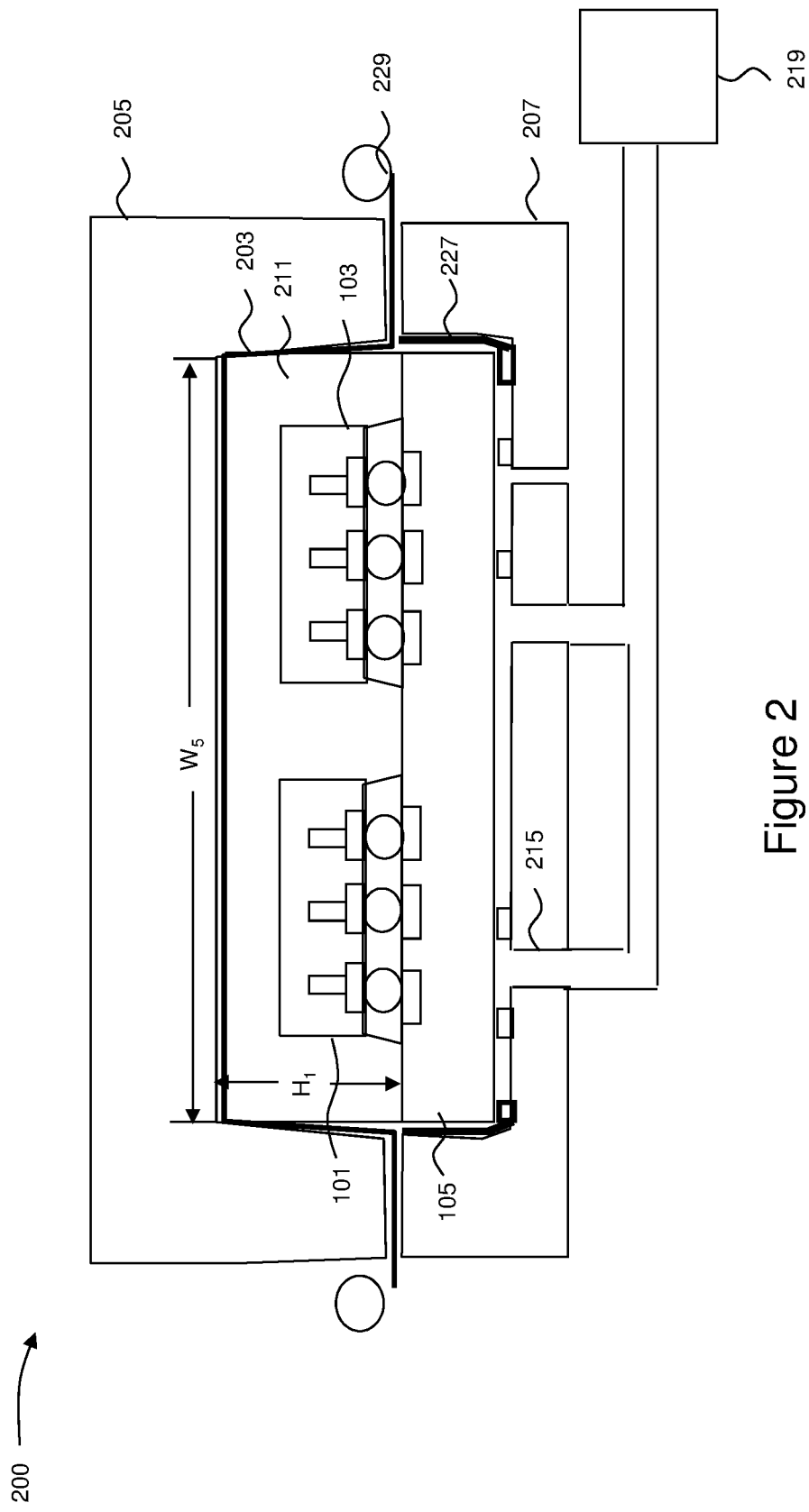
FIG. 2 illustrates a molding chamber that may be used to encapsulate the first semiconductor die, the second semiconductor die, and the semiconductor wafer in accordance with an embodiment.

FIG. 2 illustrates an encapsulation of the first semiconductor die 101 and the second semiconductor die 103 after they have been bonded to the semiconductor wafer 105. The encapsulation may be performed in a molding device 200, which may comprise a top molding portion 205 and a bottom molding portion 207 separable from the top molding portion 205. When the top molding portion 205 is lowered to be adjacent to the bottom molding portion 207, a molding cavity 203 may be formed for the bonded first semiconductor die 101, second semiconductor die 103, and semiconductor wafer 105. Accordingly, while the shape of the molding cavity 203 will be influenced by the size and shape of the bonded first semiconductor die 101, second semiconductor die 103, and semiconductor wafer 105, as an example only, the molding cavity 203 may have a fifth width $W_5$ and a first height $H_1$ sufficient to house the bonded first semiconductor die 101, second semiconductor die 103, and semiconductor wafer 105 and to form the dimensions of an encapsulant 211. For example, the molding cavity 203 may have the fifth width $W_5$ be between about 2 mm and about 450 mm, such as about 300 mm, and may also have a first height $H_1$ (over the semiconductor wafer 105) of between about 20 µm and about 900 µm, such as about 700 µm.

The bottom molding portion 207 may have a set of vacuum holes 215. The set of vacuum holes 215 may be connected to a first vacuum pump 219 in order to reduce the pressure and generate at least a partial vacuum within the set of vacuum holes 215. When the bonded first semiconductor die 101, second semiconductor die 103, and semiconductor wafer 105 are placed adjacent to the set of vacuum holes 215, this at least partial vacuum will lower the pressure in order to fix and hold the bonded first semiconductor die 101, second semiconductor die 103, and semiconductor wafer 105, thereby assuring that, once the bonded first semiconductor die 101, second semiconductor die 103, and semiconductor wafer 105 is correctly positioned within the molding cavity 203, the bonded first semiconductor die 101, second semiconductor die 103, and semiconductor wafer 105 will not move during subsequent processing, such as the encapsulation process.

The sidewalls of the bottom molding portion 207 may be coated with a release material 227. This release material 227 is intended to provide a non-adhering surface for the encapsulating material, so that, once the bonded first semiconductor die 101, second semiconductor die 103, and semiconductor wafer 105 are encapsulated, the bonded first semiconductor die 101, second semiconductor die 103, and semiconductor wafer 105 can be easily removed from the bottom molding portion 207 without adhering to the sidewalls of the bottom molding portion 207. The release material 227 may be, for example, gold, Teflon, Cr—N, combinations of these, or the like, although any suitable release material 227 may alternatively be utilized.

Also illustrated in FIG. 2 is a release film 229 positioned to be located between the top molding portion 205 and the bonded first semiconductor die 101, second semiconductor die 103, and semiconductor wafer 105. The release film 229 may be a material that allows the encapsulant to not stick, or may be released from, the surface of the top molding portion 205 once the bonded first semiconductor die 101, second semiconductor die 103, and semiconductor wafer 105 has gone through the encapsulating process. The release film 229 may comprise polyimide, vinyl chloride, PC, ETFE, PTFE, PET, FEP, polyvinylidene chloride, fluorine-containing glass cloth, synthetic paper, metallic foil, combinations of these, and the like. The release film 229 may have a thickness between about 20 µm and about 50 µm, such as about 25 µm.

During the encapsulation process the top molding portion 205 may be placed adjacent to the bottom molding portion 207, thereby enclosing the bonded first semiconductor die 101, second semiconductor die 103, and semiconductor wafer 105 within the molding cavity 203 (along with the release film 229). Once enclosed, the top molding portion 205 and the bottom molding portion 207 (along with the release film 229 sandwiched between them) may form an airtight seal in order to control the influx and outflux of gasses from the molding cavity 203. The top molding portion 205 and the bottom molding portion 207 may be pressed together using, e.g., a compression tool and a force of between about 5 KN and about 200 KN, such as between about 50 and 100 KN.

Also illustrated in FIG. 2 is the placement of an encapsulant 211 within the molding cavity 203. The encapsulant 211 may be a molding compound resin such as polyimide, PPS, PEEK, PES, a heat resistant crystal resin, combinations of these, or the like. The encapsulant 211 may be placed within the molding cavity 305 prior to the alignment of the top molding portion 205 and the bottom molding portion 207, or else may be injected into the molding cavity 203 through an injection port (not shown).

Once the encapsulant 211 has been placed into the molding cavity 203 such that the encapsulant 211 encapsulates the bonded first semiconductor die 101, second semiconductor die 103, and semiconductor wafer 105, the encapsulant 211 may be cured in order to harden the encapsulant 211 for optimum protection. While the exact curing process is dependent at least in part on the particular material chosen for the encapsulant 211, in an embodiment in which molding compound is chosen as the encapsulant 211, the curing could occur through a process such as heating the encapsulant 211 to between about 100° C. and about 130° C., such as about 125° C. for about 60 sec to about 3000 sec, such as about 600 sec. Additionally, initiators and/or catalysts may be included within the encapsulant 211 to better control the curing process.

However, as one having ordinary skill in the art will recognize, the curing process described above is merely an exemplary process and is not meant to limit the current embodiments. Other curing processes, such as irradiation or even allowing the encapsulant 211 to harden at ambient temperature, may alternatively be used. Any suitable curing process may be used, and all such processes are fully intended to be included within the scope of the embodiments discussed herein.

By encapsulating the first semiconductor die 101 and the second semiconductor die 103 with the semiconductor wafer 105, the encapsulant 211 may be utilized as an additional support structure in order to support and protect the first semiconductor die 101 and the second semiconductor die 103. This protection helps to counter the forces and stresses caused by the mismatch in sizes between, e.g., the first semiconductor die 101 and the third semiconductor die 119 after the third semiconductor die 119 has been singulated from the semiconductor wafer 105.

Figure 3:
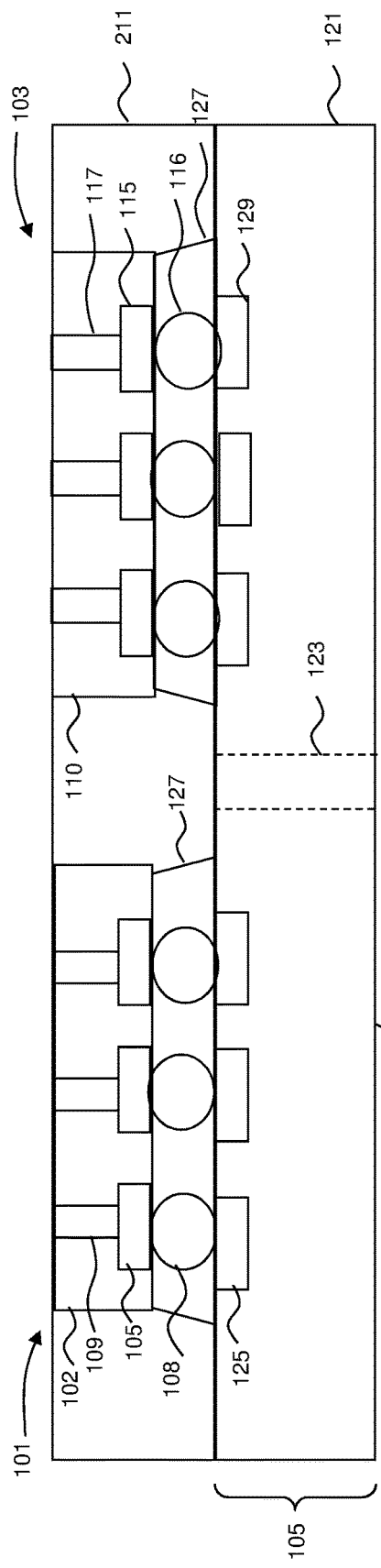
FIG. 3 illustrates a thinning of the first semiconductor die, the second semiconductor die, and the encapsulant in accordance with an embodiment.

FIG. 3 illustrates the removal of the bonded first semiconductor die 101, second semiconductor die 103, and semiconductor wafer 105 (now encapsulated with the encapsulant 211), and a thinning of the encapsulant 211 along with a thinning of the back side of the first semiconductor die 101 and the second semiconductor die 103 in order to expose the first TSVs 109 and the second TSVs 117 for further processing. The thinning may be performed, e.g., using a CMP process whereby chemical etchants and abrasives are utilized to react and grind away the encapsulant 211, the first semiconductor die 101 and the second semiconductor die 103 until the first TSVs 109 and the second TSVs 117 have been exposed. As such, the first semiconductor die 101 may have a planar surface that is also planar with the encapsulant 211 and the second semiconductor die 103 may also have a planar surface that is also planar with the encapsulant 211.

However, while the CMP process described above is presented as one illustrative embodiment, it is not intended to be limiting to the embodiments. Any other suitable removal process may alternatively be used to thin the encapsulant 211, the first semiconductor die 101, and the second semiconductor die 103. For example, a series of chemical etches may alternatively be utilized. This process and any other suitable process may alternatively be utilized to thin the encapsulant 211, the first semiconductor die 101, and the second semiconductor die 103, and to expose the first TSVs 109 and the second TSVs 117, and all such processes are fully intended to be included within the scope of the embodiments.

Figure 4:
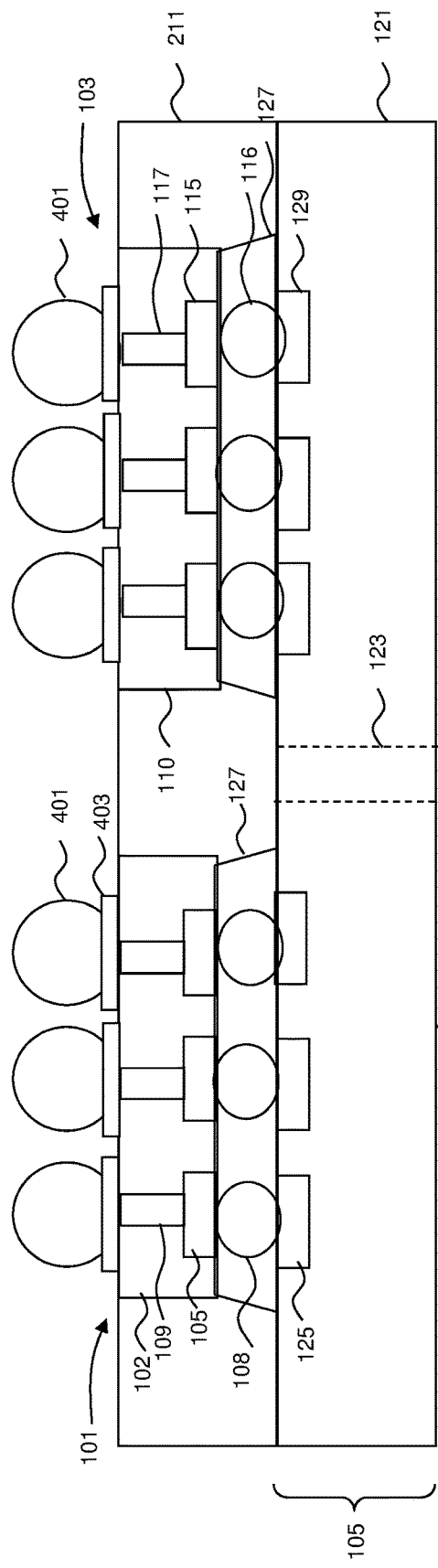
FIG. 4 illustrates the formation of a redistribution layer and external connectors on the first semiconductor die and the second semiconductor die in accordance with an embodiment.

FIG. 4 illustrates the formation of third external connectors 401 in connection with the exposed first TSVs 109 and the exposed second TSVs 117. Optionally, prior to the formation of the third external connectors 401, a redistribution layer (RDL) 403 may be formed in contact with the exposed first TSVs 109 and the exposed second TSVs 117. The RDL 403 may be utilized to allow the third external connectors 401 that are electrically connected to the first TSVs 109 and the second TSVs 117 to be placed in any desired location on the first semiconductor die 101 and the second semiconductor die 103, instead of limiting the location of the third external connectors 401 to the region directly over the first TSVs 109 and the second TSVs 117. In an embodiment the RDL 403 may be formed by initially forming a seed layer (not shown) of a titanium copper alloy through a suitable formation process such as CVD or sputtering. A photoresist (not shown) may then be formed to cover the seed layer, and the photoresist may then be patterned to expose those portions of the seed layer that are located where the RDL 403 is desired to be located.

Once the photoresist has been formed and patterned, a conductive material, such as copper, may be formed on the seed layer through a deposition process such as plating. The conductive material may be formed to have a thickness of between about 1 µm and about 10 µm, such as about 5 µm, and a width along the first substrate 102 of between about 5 µm and about 300 µm, such as about 15 µm. However, while the material and methods discussed are suitable to form the conductive material, these materials are merely exemplary. Any other suitable materials, such as AlCu or Au, and any other suitable processes of formation, such as CVD or PVD, may alternatively be used to form the RDL 403.

Once the conductive material has been formed, the photoresist may be removed through a suitable removal process such as ashing. Additionally, after the removal of the photoresist, those portions of the seed layer that were covered by the photoresist may be removed through, for example, a suitable etch process using the conductive material as a mask.

The third external connectors 401 may be formed on the RDL 403 and may comprise a material such as tin, or other suitable materials, such as silver or copper. In an embodiment in which the third external connectors 401 are tin solder bumps, the third external connectors 401 may be formed by initially forming a layer of tin through any suitable method such as evaporation, electroplating, printing, solder transfer, ball placement, etc., to a preferred thickness of about 100 µm. Once a layer of tin has been formed on the structure, a reflow is preferably performed in order to shape the material into the desired bump shape.

Figure 5:
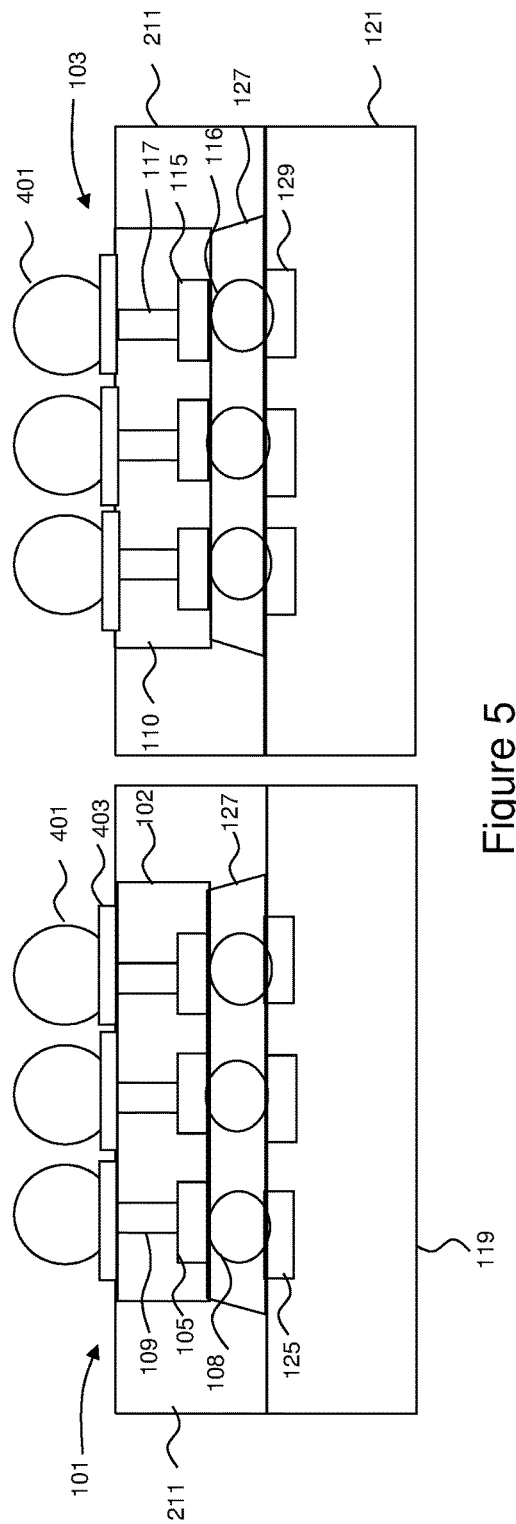
FIG. 5 illustrates a singulation of the semiconductor wafer in accordance with an embodiment.

FIG. 5 illustrates the singulation of the third semiconductor die 119 (bonded and encapsulated to the first semiconductor die 101) and the fourth semiconductor die 121 (bonded and encapsulated to the second semiconductor die 103) from the semiconductor wafer 105. In an embodiment the singulation may be performed by using a saw blade (not shown) to slice the semiconductor wafer 105 within the scribe line 123 (not illustrated in FIG. 5 but illustrated in FIG. 4) between the third semiconductor die 119 and the fourth semiconductor die 121, thereby separating the third semiconductor die 119 and the fourth semiconductor die 121 from the semiconductor wafer 105. Additionally, the saw blade also cuts through the encapsulant 211 located over the scribe line 123, causing the encapsulant 211 over the first semiconductor die 101 and the third semiconductor die 119 to be aligned with each other along the cut.

However, as one of ordinary skill in the art will recognize, utilizing a saw blade to singulate the third semiconductor die 119 and the fourth semiconductor die 121 from the semiconductor wafer 105 is merely one illustrative embodiment and is not intended to be limiting. Alternative methods for singulating the third semiconductor die 119 and the fourth semiconductor die 121, such as utilizing one or more etches to separate the third semiconductor die 119 and the fourth semiconductor die 121 from the semiconductor wafer 105, may alternatively be utilized. These methods and any other suitable methods may alternatively be utilized to singulate the third semiconductor die 119 and the fourth semiconductor die 121 from the semiconductor wafer 105.

Figure 6:
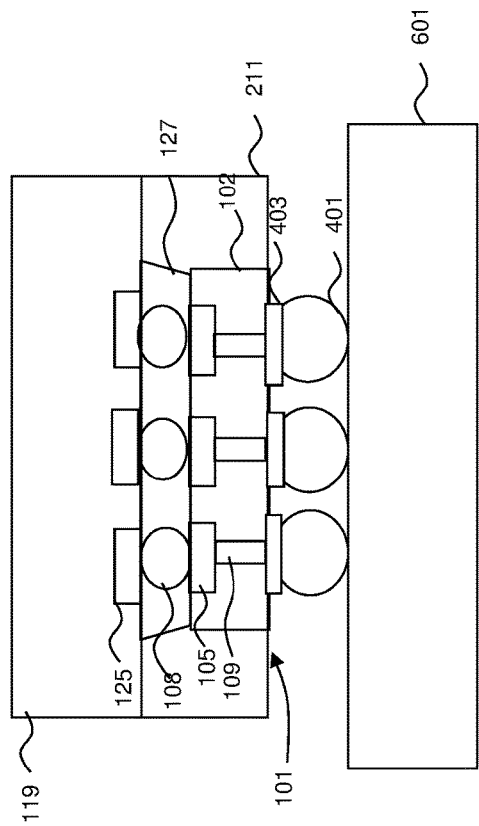
FIG. 6 illustrates a placement of the first semiconductor die onto a substrate in accordance with an embodiment.

FIG. 6 illustrates the placement of the first semiconductor die 101 (with the third semiconductor die 119 bonded to it) onto a third substrate 601. The third substrate 601 may be utilized to support and protect the first semiconductor die 101 and the third semiconductor die 119 while also being used to provide a connection between the third external connectors 401 on the first semiconductor die 101 to external devices (not shown). In an embodiment the third substrate 601 may be a printed circuit board and may be laminate substrate formed as a stack of multiple thin layers (or laminates) of a polymer material such as bismaleimide triazine (BT), FR-4, or the like. However, any other suitable substrate, such as an organic substrate, a ceramic substrate, or the like, may alternatively be utilized, and all such substrates that provide support and connectivity to the first semiconductor die 101 and the third semiconductor die 119 are fully intended to be included within the scope of the embodiments.

By encapsulating the first semiconductor die 101 and the second semiconductor die 103 as described in the above embodiments, the first semiconductor die 101 and the second semiconductor die 103 are provided greater protection from the stresses and pressures caused by their smaller size in relation to the third semiconductor die 119 and the fourth semiconductor die 121, respectively. By providing greater support to the first semiconductor die 101 and the second semiconductor die 103, fewer defects may be caused by the stresses and pressures caused by their size mismatch, and the overall structure will be able to better withstand the stresses and pressures of further processing and operation.

In accordance with an embodiment, a method for manufacturing a semiconductor device comprising connecting a first semiconductor die with a first width to a second semiconductor die with a second width, wherein the first width is less than the second width and wherein the second semiconductor die is part of a semiconductor wafer, is provided. The first semiconductor die is encapsulated with an encapsulant, wherein the encapsulant is in contact with the first semiconductor die and the second semiconductor die. The first semiconductor die is thinned to expose a first through substrate via, the thinning the first semiconductor die removing a portion of the encapsulant, and the second semiconductor die is singulated from the semiconductor wafer.

In accordance with another embodiment, a method for manufacturing a semiconductor device comprising bonding a first semiconductor die to a second semiconductor die, the second semiconductor die being part of a semiconductor wafer, wherein the first semiconductor die is smaller than the second semiconductor die and wherein the first semiconductor die has first conductive material extending at least partially through the first semiconductor die, is provided. An encapsulant is placed over the first semiconductor die and the second semiconductor die. A portion of the encapsulant and the first semiconductor die are removed to expose the first conductive material, and the second semiconductor die is removed from the semiconductor wafer.

In accordance with yet another embodiment, a semiconductor device comprising a first semiconductor die with a first width and a first top surface and at least one through substrate via extending through the first semiconductor die is provided. A second semiconductor die is connected to the first semiconductor die, the second semiconductor die having a second width greater than the first width, the second semiconductor die having a first sidewall. An encapsulant encapsulates the first semiconductor die, the encapsulant having a second sidewall aligned with the first sidewall and having a top surface aligned with the first top surface of the first semiconductor die.

In accordance with yet another embodiment, a semiconductor device comprising a first die with a first width over a second die with a second width, wherein the second width is larger than the first width is provided. Through substrate vias extend through the first die, and an encapsulant has a first edge planar with a top surface of the first die and a second edge in physical contact with and planar with a side surface of the second die.

In accordance with yet another embodiment, a semiconductor device comprising a first die encapsulated with an encapsulant, wherein the encapsulant is planar with a top surface of the first die is provided. Through substrate vias extend through the first die from a bottom surface of the first die to the top surface of the first die, and a second die is electrically connected to the first die, the second die extending beyond the first die in a first direction that is parallel with the top surface, the second die having a first side that is perpendicular to the first direction and is planar with the encapsulant.

In accordance with yet another embodiment, a semiconductor device comprising a first semiconductor device with a first width and a second semiconductor device with a second width over the first semiconductor device, the second width being less than the first width is provided. An encapsulant extends between a first sidewall of the second semiconductor device and a top surface of the first semiconductor device, the first sidewall being perpendicular with the top surface, wherein the encapsulant does not extend beyond the first semiconductor device in a first direction and does not extend beyond the second semiconductor device in a second direction perpendicular to the first direction.

Although the embodiments and their advantages have been described in detail, it should be understood that various changes, substitutions and alterations can be made herein without departing from the spirit and scope of the embodiments as defined by the appended claims. For example, the precise materials or methods of formation for many of the features may be altered. Additionally, the precise methods used to bond the semiconductor dies may also be modified.

Moreover, the scope of the present application is not intended to be limited to the particular embodiments of the process, machine, manufacture, composition of matter, means, methods and steps described in the specification. As one of ordinary skill in the art will readily appreciate from the disclosure of the embodiments, processes, machines, manufacture, compositions of matter, means, methods, or steps, presently existing or later to be developed, that perform substantially the same function or achieve substantially the same result as the corresponding embodiments described herein may be utilized according to the embodiments. Accordingly, the appended claims are intended to include within their scope such processes, machines, manufacture, compositions of matter, means, methods, or steps.

What is claimed is:

1. A semiconductor device comprising:
   a first die with a first width over a second die with a second width, wherein the second width is larger than the first width;
   a through via in a substrate of the first die, wherein the through via has a top surface coplanar with a top surface of the substrate of the first die, wherein the through via has a bottom surface within the first die;
   an underfill material between the first die and the second die; and
   an encapsulant extending along a surface of the underfill material and a surface of the second die.

2. The semiconductor device of claim 1, wherein the encapsulant comprises a molding compound material.

3. The semiconductor device of claim 1, wherein the encapsulant has an edge in physical contact with a side surface of the second die.

4. The semiconductor device of claim 3, wherein the edge of the encapsulant is coplanar with the side surface of the second die.

5. The semiconductor device of claim 1, wherein the encapsulant has a top surface coplanar with a top surface of the first die.

6. The semiconductor device of claim 1, wherein a connector is between the first die and second die and surrounded by the underfill material.

7. The semiconductor device of claim 6, wherein the connector comprises a solder bump.

8. The semiconductor device of claim 1, wherein the second die is a memory die.

9. The semiconductor device of claim 1, wherein the first die is bonded to the second die with a copper-to-copper bonding structure.

10. A semiconductor device comprising:
 a first die over a second die;
 a through via in a substrate of the first die;
 an underfill material between the first die and the second die;
 an encapsulant encapsulating the first die and extending along a surface of the underfill material and a surface of the second die; and
 a solder bump over the first die and electrically coupled to the through via, wherein the through via has a top surface coplanar with a top surface of the substrate of the first die.

11. The semiconductor device of claim 10, wherein the first die is smaller than the second die.

12. The semiconductor device of claim 10, wherein the encapsulant comprises a molding compound material.

13. The semiconductor device of claim 10, wherein the encapsulant has a sidewall in physical contact with a sidewall of the second die.

14. The semiconductor device of claim 13, wherein the sidewall of the encapsulant is coplanar with the sidewall of the second die.

15. The semiconductor device of claim 10, wherein the encapsulant has a surface coplanar with a surface of the first die.

16. The semiconductor device of claim 10, wherein a connector is between the first die and second die and surrounded by the underfill material.

17. The semiconductor device of claim 10, wherein the first die is bonded to the second die with a copper-to-copper bonding structure.

18. A semiconductor device comprising:
 a first die having a first width bonded to a second die having a second width, the first and second dies being bonded with a connector, the second width being larger than the first width;
 a through via in a substrate of the first die;
 an encapsulant contacting a surface of the second die and has an edge coplanar with a side surface of the second die;
 a redistribution layer on a top surface of the first die, the redistribution layer being electrically coupled and physically contacting the through via;
 a solder bump on and electrically coupled to the redistribution layer; and
 a second substrate over the first die and bonded to the solder bump.

19. The semiconductor device of claim 18, wherein the connector is a copper-to-copper bonding structure.

20. The semiconductor device of claim 18, the connector is a solder bump.

* * * * *